(12) United States Patent
Baur (10) Patent No.: US 10,283,676 B2
(45) Date of Patent: May 7, 2019

(54) LIGHT-EMITTING DIODE CHIP WITH ONE OF A MIRROR LAYER AND AN ADHESION-PROMOTING LAYER FOR HIGH EFFICIENCY AND LONG SERVICE LIFE

(71) Applicant: OSRAM Opto Semiconductors GmbH, Regensburg (DE)

(72) Inventor: Johannes Baur, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/769,996

(22) PCT Filed: Oct. 19, 2016

(86) PCT No.: PCT/EP2016/075092
§ 371 (c)(1),
(2) Date: Apr. 20, 2018

(87) PCT Pub. No.: WO2017/067983
PCT Pub. Date: Apr. 27, 2017

(65) Prior Publication Data
US 2018/0301598 A1    Oct. 18, 2018

(30) Foreign Application Priority Data

Oct. 22, 2015    (DE) .................. 10 2015 118 041

(51) Int. Cl.
*H01L 33/44* (2010.01)
*H01L 33/30* (2010.01)
(Continued)

(52) U.S. Cl.
CPC .............. *H01L 33/44* (2013.01); *H01L 33/30* (2013.01); *H01L 33/387* (2013.01);
(Continued)

(58) Field of Classification Search
CPC ..... H01L 33/30; H01L 33/387; H01L 33/405; H01L 33/44; H01L 33/46
See application file for complete search history.

(56) References Cited

U.S. PATENT DOCUMENTS

| 4,058,430 A | 11/1977 | Suntola et al. |
| 5,925,896 A * | 7/1999 | Dutta ................. H01L 33/10 257/103 |

(Continued)

FOREIGN PATENT DOCUMENTS

| DE | 10 2008 048 648 A1 | 4/2010 |
| DE | 10 2010 014 667 A1 | 10/2011 |

(Continued)

*Primary Examiner* — Andrew Q Tran
(74) *Attorney, Agent, or Firm* — DLA Piper LLP (US)

(57) ABSTRACT

A light-emitting diode chip includes a semiconductor layer sequence based on InGaAlAsP and generates visible light or near-infrared radiation, a current spreading layer located directly on the semiconductor layer sequence and based on AlGaAs, an encapsulation layer applied directly to at least one of the current spreading layer and the semiconductor layer sequence and has an average thickness of 10 nm to 200 nm and a defect density of at most $10/mm^2$, at least one cover layer applied directly to the encapsulation layer at least in places, at least one non-metallic reflection layer located in places on a side of the current spreading layer facing away from the semiconductor layer sequence and covered in places by the encapsulation layer, and at least one of a mirror layer and an adhesion-promoting layer arranged in places on a side of the reflection layer facing away from the current spreading layers.

18 Claims, 8 Drawing Sheets

(51) Int. Cl.
  *H01L 33/38* (2010.01)
  *H01L 33/40* (2010.01)
  *H01L 33/46* (2010.01)
  H01L 33/00 (2010.01)
  H01L 33/14 (2010.01)
  H01L 33/20 (2010.01)
  H01L 33/42 (2010.01)

(52) U.S. Cl.
  CPC ............ *H01L 33/405* (2013.01); *H01L 33/46* (2013.01); *H01L 33/0079* (2013.01); *H01L 33/14* (2013.01); *H01L 33/20* (2013.01); *H01L 33/42* (2013.01); *H01L 2933/0025* (2013.01)

(56) References Cited

U.S. PATENT DOCUMENTS

| | | | |
|---|---|---|---|
| 7,910,941 B2* | 3/2011 | Chen | H04L 33/44 |
| | | | 257/233 |
| 2009/0072257 A1 | 3/2009 | Unno et al. | |
| 2012/0086026 A1* | 4/2012 | Engl | H01L 27/156 |
| | | | 257/93 |
| 2012/0098016 A1 | 4/2012 | Höppel et al. | |
| 2012/0326178 A1 | 12/2012 | Fehrer et al. | |
| 2014/0061702 A1 | 3/2014 | Yamamoto et al. | |
| 2014/0301085 A1* | 10/2014 | Hwang | F21V 5/04 |
| | | | 362/308 |

FOREIGN PATENT DOCUMENTS

| DE | 10 2013 100 818 A1 | 7/2014 |
|---|---|---|
| DE | 10 2013 103 079 A1 | 10/2014 |
| DE | 11 2012 006 689 T5 | 3/2015 |

* cited by examiner

FIG 16

LIGHT-EMITTING DIODE CHIP WITH ONE OF A MIRROR LAYER AND AN ADHESION-PROMOTING LAYER FOR HIGH EFFICIENCY AND LONG SERVICE LIFE

TECHNICAL FIELD

This disclosure relates to a light-emitting diode chip and a method of producing a light-emitting diode chip.

BACKGROUND

There is a need to provide light-emitting diode chips having a high efficiency and a long service life.

SUMMARY

I provide a light-emitting diode chip including a semiconductor layer sequence based on InGaAlAsP and generates visible light or near-infrared radiation, a current spreading layer located directly on the semiconductor layer sequence and based on AlGaAs, an encapsulation layer applied directly to at least one of the current spreading layer and the semiconductor layer sequence and has an average thickness of 10 nm to 200 nm and a defect density of at most $10/mm^2$, at least one cover layer applied directly to the encapsulation layer at least in places, at least one non-metallic reflection layer located in places on a side of the current spreading layer facing away from the semiconductor layer sequence and covered in places by the encapsulation layer, and at least one of a mirror layer and an adhesion-promoting layer arranged in places on a side of the reflection layer facing away from the current spreading layers and supplies current to an electrical contact area, wherein the cover layer has a greater average thickness than the encapsulation layer, the encapsulation layer completely and directly covers outer facets of the current spreading layer, and the reflection layer projects beyond the current spreading layer and the semiconductor layer sequence, viewed in plan view, and the encapsulation layer is directly applied to partial regions of the reflection layer projecting beyond the current spreading layer.

I also provide a method by which the light-emitting diode chip including a semiconductor layer sequence based on InGaAlAsP and generates visible light or near-infrared radiation, a current spreading layer located directly on the semiconductor layer sequence and based on AlGaAs, an encapsulation layer applied directly to at least one of the current spreading layer and the semiconductor layer sequence and has an average thickness of 10 nm to 200 nm and a defect density of at most $10/mm^2$, at least one cover layer applied directly to the encapsulation layer at least in places, at least one non-metallic reflection layer located in places on a side of the current spreading layer facing away from the semiconductor layer sequence and covered in places by the encapsulation layer, and at least one of a mirror layer and an adhesion-promoting layer arranged in places on a side of the reflection layer facing away from the current spreading layers and supplies current to an electrical contact area, wherein the cover layer has a greater average thickness than the encapsulation layer, the encapsulation layer completely and directly covers outer facets of the current spreading layer, and the reflection layer projects beyond the current spreading layer and the semiconductor layer sequence, viewed in plan view, and the encapsulation layer is directly applied to partial regions of the reflection layer projecting beyond the current spreading layer is produced.

I further provide a light-emitting diode chip including a semiconductor layer sequence based on InGaAlAsP and generates visible light or near-infrared radiation, a current spreading layer located directly on the semiconductor layer sequence and based on AlGaAs, an encapsulation layer applied directly to at least one of the current spreading layer and the semiconductor layer sequence and has an average thickness of 10 nm to 200 nm and a defect density of at most $10/mm^2$, at least one cover layer applied directly to the encapsulation layer at least in places, at least one non-metallic reflection layer located in places on a side of the current spreading layer facing away from the semiconductor layer sequence and covered in places by the encapsulation layer, and at least one of a mirror layer and an adhesion-promoting layer arranged in places on a side of the reflection layer facing away from the current spreading layers and supplies current to an electrical contact area, in which the reflection layer is divided at least in places into two partial layers which succeed one another along a growth direction of the semiconductor layer sequence, wherein at least one of the encapsulation layer and the additional encapsulation layer is/are located between the two partial layers.

I further yet provide a light-emitting diode chip including a semiconductor layer sequence based on InGaAlAsP and generates visible light or near-infrared radiation, a current spreading layer located directly on the semiconductor layer sequence and based on AlGaAs, an encapsulation layer applied directly to at least one of the current spreading layer and the semiconductor layer sequence and has an average thickness of 10 nm to 200 nm and a defect density of at most $10/mm^2$, at least one cover layer applied directly to the encapsulation layer at least in places, at least one non-metallic reflection layer located in places on a side of the current spreading layer facing away from the semiconductor layer sequence and covered in places by the encapsulation layer, and at least one of a mirror layer and an adhesion-promoting layer arranged in places on a side of the reflection layer facing away from the current spreading layers and supplies current to an electrical contact area, in which the reflection layer completely penetrates the current spreading layer in places so that in a plan view the current spreading layer has an outer circumferential edge electrically insulated from a center of the current spreading layer by the reflection layer, and the at least one electrical contact area is located in the center.

I also further provide a light-emitting diode chip including a semiconductor layer sequence based on InGaAlAsP and generates visible light or near-infrared radiation, a current spreading layer located directly on the semiconductor layer sequence and based on AlGaAs, an encapsulation layer applied directly to at least one of the current spreading layer and the semiconductor layer sequence and has an average thickness of 10 nm to 200 nm and a defect density of at most $10/mm^2$, at least one cover layer applied directly to the encapsulation layer at least in places, at least one non-metallic reflection layer located in places on a side of the current spreading layer facing away from the semiconductor layer sequence and covered in places by the encapsulation layer, and at least one of a mirror layer and an adhesion-promoting layer arranged in places on a side of the reflection layer facing away from the current spreading layers and supplies current to an electrical contact area, in which at least one electrical contact region is arranged directly on a side of the current spreading layer facing away from the semiconductor layer sequence, the electrical contact region includes a central region and an edge region, and the electrical contact region includes the electrical contact area, wherein the following layers follow one another directly in the specified sequence in the central region: current spreading layer, a metallic contact layer, a metallic adhesion layer, and the mirror layer, and the following layers follow one another directly in the specified sequence in the edge region: the current spreading layer, the contact layer, the metallic adhesion layer, the additional encapsulation layer, the adhesion-promoting layer, and the mirror layer.

LIST OF REFERENCE SIGNS 1 light-emitting diode chip
2 semiconductor layer sequence
20 radiation main side
22 active zone
25 facet
3 current spreading layer
33 center of the current spreading layer
36 edge of the current spreading layer
4 encapsulation layer
42 additional encapsulation layer
5 cover layer
55 protective layer
6 reflection layer
66 light scattering structure
71 mirror layer
72 adhesion-promoting layer
73 metallic contact layer
74 metallic adhesion layer
8 electrical contact area
85 electrical contact
86 strip wall
9 carrier
91 solder
95 edge prism
G growth direction

DETAILED DESCRIPTION

My light-emitting diode chip may comprise a semiconductor layer sequence. The semiconductor layer sequence has at least one active zone designed to generate radiation during operation of the light-emitting diode chip. The generated radiation is preferably incoherent. The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$ or $Al_nGa_mIn_{1-n-m}As_kP_{1-k}$, wherein in each case $0 \leq n \leq 1$, $0 \leq m \leq 1$ and $n+m \leq 1$ and $0 \leq k < 1$. Preferably, to at least one layer or to all layers of the semiconductor layer sequence it applies that $0 \leq n \leq 0.8$, $0.4 \leq m < 1$ and $n+m \leq 0.95$ as well as $0 < k \leq 0.5$. However, the semiconductor layer sequence can have dopants and additional components. For the sake of simplicity, however, only the essential components of the crystal lattice of the semiconductor layer sequence, that is Al, As, Ga, In, N or P, are mentioned even if these can be partially replaced and/or supplemented by small quantities of further substances.

For example, green, yellow or red light is generated during operation of the semiconductor layer sequence. Green light relates in particular to a dominant wavelength of the emitted light of 500 nm to 540 nm, yellow light to a wavelength range of 560 nm to 580 nm, and red light, for example, to a wavelength range for the dominant wavelength of 600 nm to 700 nm.

The semiconductor layer sequence may be based on the material system InGaAlP or InGaAlAsP. This means that the semiconductor layer sequence comprises as main constituents In, Ga, Al and P or In, Ga, Al, As and P. In this case, the semiconductor layer sequence in particular generates red light or near-infrared radiation. Near-infrared radiation denotes, for example, radiation having a wavelength of maximum intensity of 800 nm to 1500 nm.

The light-emitting diode chip may comprise a current spreading layer. The current spreading layer serves to distribute current in the direction perpendicular to a growth direction of the semiconductor layer sequence and, thus, in a lateral direction. Specifically proceeding from point-like electrical contact areas, a current distribution in the lateral direction is effected by the current spreading layer.

The current spreading layer may be located directly on the semiconductor layer sequence. For example, the current spreading layer is grown directly onto the semiconductor layer sequence, in particular grown epitaxially. The semiconductor layer sequence and the current spreading layer can be produced in the same growth reactor directly one after the other without intermediate steps and using the same method.

The current spreading layer is likewise formed from a semiconductor material. In this case, however, the current spreading layer is separated purely conceptually from the semiconductor layer sequence. The term 'semiconductor layer sequence' thus relates to the layers set up to generate light, whereas the term 'current spreading layer' aims at a lateral current spreading as the main function of this layer.

The current spreading layer may be based on a different material system than the semiconductor layer sequence. In particular, in the semiconductor layer sequence, a main component of a crystal lattice is phosphorus. In other words, the semiconductor layer sequence is then based on a phosphide. In this case, the current spreading layer is preferably an arsenide. In particular, the current spreading layer is based on the material system AlGaAs.

The light-emitting diode chip may contain at least one encapsulation layer. The encapsulation layer protects the current spreading layer from damage, for example, by moisture. In particular, AlGaAs tends to decompose under the action of moisture and thus impair the functionality of the light-emitting diode chip. Such damage to the current spreading layer can be reduced by the encapsulation layer.

The encapsulation layer may be located directly on the current spreading layer and/or on the semiconductor layer sequence in places. It is possible for the encapsulation layer to cover all exposed side faces of the semiconductor layer sequence and/or the current spreading layer. In this case, 'exposed' means in particular that corresponding areas are not covered by semiconductor materials or current-carrying materials.

The encapsulation layer may have a mean thickness of at least 10 nm or 20 nm or 30 nm. Alternatively or additionally, the mean thickness of the encapsulation layer is at most 300 nm or 150 nm or 90 nm. In particular, the mean thickness is approximately 40 nm or 70 nm.

The encapsulation layer may have an average defect density of at most $10/mm^2$ or $1/mm^2$ or $0.1/mm^2$. Such very low defect densities lead to high tightness of the encapsulation layer. This can be achieved by producing the encapsulation layer by atomic layer deposition.

An atomic layer deposition, ALD for short, is specified, for example, in U.S. Pat. No. 4,058,430 A, the subject matter of which is incorporated herein by reference.

The encapsulation layer may have a specific diffusion constant for water and/or oxygen of at most $10^{-5}$ g/(m² d). The specific diffusion constant is, in particular, calculated for a material thickness of 100 nm. The diffusion constant is preferably at most $5\times10^{-6}$ g/(m² d), in particular at most $10^{-6}$ g/(m² d).

The light-emitting diode chip may comprise one or more cover layers. The at least one cover layer is applied to the encapsulation layer over the whole area or in places. The cover layer is preferably impermeable to liquids. In particular, the cover layer is impermeable to water in liquid form. The cover layer is preferably produced by chemical or physical vapor deposition, also referred to as CVD or PVD.

The light-emitting diode chip may comprise one or more reflection layers. The at least one reflection layer is a non-metallic layer, for example, of an electrically insulating material. In particular, the reflection layer serves for total reflection of radiation generated in the semiconductor layer sequence. A material from which the reflection layer is produced is preferably transparent to the radiation generated in the semiconductor layer sequence. The reflection layer is preferably formed from an oxide or nitride.

The reflection layer may be located on a side of the current spreading layer facing away from the semiconductor layer sequence. In this case, the reflection layer can directly adjoin the current spreading layer. It is likewise possible for the reflection layer to be applied at a distance from the current spreading layer.

The reflection layer may be located directly on the encapsulation layer in places. In particular, the encapsulation layer covers side faces of the reflection layer.

At least one current-conducting layer may be located on a side of the reflection layer facing away from the current spreading layer. The current-conducting layer is preferably set up for ohmic current conduction in the direction perpendicular to the active zone. In particular, the at least one current-conducting layer is produced from a metal or an electrically conductive oxide, also referred to as TCO.

The current-conducting layer may be set up to effect a current conduction towards at least one electrical contact area. For example, all contact areas are used for a specific connection type, for example, a p-type contact or an n-contact, and are supplied with current through the current-conducting layer. The at least one current-conducting layer or at least one of the current-conducting layers is preferably formed from a material impermeable and reflective to the radiation generated in the semiconductor layer sequence. In other words, at least one of the current-conducting layers can form a mirror for the generated radiation. Furthermore, a further current-conducting layer can form an adhesion-promoting layer.

The light-emitting diode chip may comprise a semiconductor layer sequence based on InGaAlAsP, preferably on InGaP, and configured to generate visible light or near-infrared radiation. A current spreading layer is located directly on the semiconductor layer sequence and is based on AlGaAs. An encapsulation layer is applied in places directly on the current spreading layer and/or on the semiconductor layer sequence. An average thickness of the encapsulation layer is 10 nm to 200 nm and a defect density of the encapsulation layer is at most $10/mm^2$.

At least one cover layer is applied directly to the encapsulation layer at least in places. At least one non-metallic reflection layer is located in direct or indirect contact on a side of the current spreading layer facing away from the semiconductor layer sequence, the reflection layer is designed for total reflection of radiation. The at least one reflection layer is covered directly or indirectly by the encapsulation layer in places, for example, on a main side or on a side surface. At least one current-conducting layer is located in direct or indirect contact on a side of the reflection layer facing away from the current spreading layer, the current-conducting layer can be formed as a mirror layer and/or as an adhesion-promoting layer or can consist of such layers. The at least one current-conducting layer can directly adjoin electrical contact areas to impress current into the semiconductor layer sequence.

If light-emitting diode chips on the basis of InGaP are stored or operated in a moist environment, in layers made of AlGaAs having a high aluminum content, corrosion of the AlGaAs regularly occurs. This can lead to inhomogeneous luminous images and a voltage rise and also a total failure of the light-emitting diode chips in the event of strong occurrence. To counteract this, there is a possibility to keep a layer thickness of the AlGaAs layer as small as possible and select an aluminum content as small as possible.

Likewise, AlGaAs layers are protected as far as possible against humidity by dielectric layers such as silicon nitride or silicon dioxide. However, such dielectric layers are only moisture-proof to a limited extent so that ageing of the light-emitting diode chip is only delayed. On the other hand, adhesion of such dielectric layers to the semiconductor material is only comparatively poor. Such dielectric layers are therefore unable to bring about sufficient ageing stabilization. Furthermore, it is possible to replace the AlGaAs layer with GaP as a contact material to replace the component susceptible to ageing in such light-emitting diode chips.

In the light-emitting diode chips described here, a sufficiently thick AlGaAs layer can be used. This is achieved by using a high-density encapsulation layer produced with atomic layer deposition to protect the AlGaAs current spreading layer. Due to the increased service life of the light-emitting diode chips, the comparatively high production costs for the encapsulation layer because of the atomic layer deposition can be justified.

An aluminum content in the AlGaAs of the current spreading layer may be at least 20% or 40% or 60%. Alternatively or additionally, the aluminum content is at most 80% or 70% or 60%. For example, an aluminum content of 50% means that 50% of the lattice sites of gallium in the crystal lattice GaAs are replaced by aluminum atoms. The current spreading layer preferably has a plurality of partial layers having different Al contents. For example, a thin partial layer made of GaAs is present, followed by a thicker partial layer of AlGaAs, in turn followed by an even thicker AlGaAs partial layer having a higher Al content. In a light-emitting diode chip that generates visible light, in particular a 5 nm thick GaAs layer is present, followed by a 50 nm AlGaAs layer having an Al content of 60%, followed by a 200 nm AlGaAs layer having an Al content of 70%; the cited values for the thickness and the Al content preferably apply with a tolerance of at most 25% or 10%. When the light-emitting diode chip generates infrared radiation, it is possible that the current spreading layer is formed from only a single layer, for example, of AlGaAs with 24% Al. The GaAs partial layer can face the semiconductor layer sequence or face away from the semiconductor layer sequence.

The encapsulation layer may be an $Al_2O_3$ layer. In other words, the encapsulation layer is then a homogeneous layer of aluminum oxide. A layer thickness of the encapsulation layer is preferably constant over the entire encapsulation layer.

The cover layer may have a greater average thickness than the encapsulation layer. For example, the average thickness of the cover layer is at least 80 nm or 150 nm or 200 nm. Alternatively or additionally, the average thickness of the cover layer is at most 1 µm or 600 nm or 400 nm.

The encapsulation layer may completely and directly cover outer facets of the current spreading layer. The outer facets of the current spreading layer are in this case facets which lie furthest on the outside of the light-emitting diode chip.

The reflection layer and/or the at least one current-conducting layer in each case may project laterally beyond the current spreading layer and/or the semiconductor layer sequence, viewed in plan view. In other words, a base area of the reflection layer and/or a base area of the current-conducting layer can be larger than a base area of the current spreading layer and/or of the semiconductor layer sequence.

The encapsulation layer may be applied directly to such partial regions of the reflection layer which project laterally beyond the current spreading layer. In particular, on a side facing the semiconductor layer sequence, the reflection layer is then completely covered by the encapsulation layer in the sub-region located next to the semiconductor layer sequence. Side surfaces of the reflection layer, oriented approximately parallel to the growth direction of the semiconductor layer sequence, can be free of the encapsulation layer.

The reflection layer may terminate flush with the current spreading layer when viewed in plan view. This can mean that an edge of the reflection layer and an edge of the current spreading layer lie one above the other with a tolerance of at most 1 µm or 0.5 µm or 0.1 µm or exactly, viewed in a plan view.

The encapsulation layer may directly and completely cover outer facets of the current spreading layer and/or of the reflection layer. In other words, outer boundary surfaces of the reflection layer and/or of the current spreading layer are then protected by the encapsulation layer.

The encapsulation layer, viewed in plan view, may be applied directly to one of the current conducting layers or to the current conducting layer alongside the current spreading layer. As a result, complete encapsulation of the reflection layer can be achieved. In particular, it is possible for the reflection layer to be completely surrounded all around by the current spreading layer together with the encapsulation layer and the current conducting layer.

The light-emitting diode chip may also comprise an additional encapsulation layer. The additional encapsulation layer, like the encapsulation layer, is produced by atomic layer deposition and therefore has, corresponding to the encapsulation layer, a high resistance to diffusion and a low defect density.

The additional encapsulation layer and the encapsulation layer may be produced from the same material. In particular, both layers consist of $Al_2O_3$. The additional encapsulation layer and the encapsulation layer are preferably produced in different method steps. In particular, further method steps take place between the production of the additional encapsulation layer and that of the encapsulation layer.

The additional encapsulation layer may be applied directly to a side of the current spreading layer facing away from the semiconductor layer sequence. This side of the current spreading layer can be completely covered by the additional encapsulation layer, together with the electrical contact area.

The additional encapsulation layer and the encapsulation layer may touch each other in places. Preferably, a tight encapsulation is provided in a contact region in which the additional encapsulation layer and the encapsulation layer touch. In other words, the contact region then has, compared to the encapsulation layer, no increased permeability, for example, for moisture or oxygen.

The reflection layer may not be in direct contact with the semiconductor layer sequence and/or the current spreading layer at any point. In particular, the additional encapsulation layer is located between the current spreading layer and the reflection layer, at least in places.

The semiconductor layer sequence and the current spreading layer may be completely enclosed by the encapsulation layer together with the optionally present additional encapsulation layer and together with the electrical contact areas. In particular, a radiation main side of the semiconductor layer sequence facing away from the current spreading layer is also completely covered by an electrical contact area and the encapsulation layer. The cover layer can also be applied to the radiation main side.

The electrical contact area may be a contact metallization. In other words, the electrical contact area is then formed from a metal or a metal alloy. Preferably, a plurality of contact areas made of the same material are located on the current spreading layer. A further electrical contact area is preferably applied on the radiation exit side of the semiconductor layer sequence. The contact area on the radiation exit side can be formed from a different, preferably metallic material.

The reflection layer may be divided at least in places into two or more than two partial layers. The partial layers of the reflection layer follow one another along the growth direction of the semiconductor layer sequence.

The encapsulation layer and/or the additional encapsulation layer may be located at least in places between the two partial layers of the reflection layer. In this way, an efficient processability can be achieved with simultaneous high protection of the current spreading layer against moisture by the encapsulation layer and/or the additional encapsulation layer. Thus, the encapsulation layer and/or the additional encapsulation layer can serve as an etching stop layer.

The encapsulation layer and/or the additional encapsulation layer may represent an etching stop layer for the current spreading layer, the semiconductor layer sequence and/or the reflection layer. In other words, in this case the current spreading layer can be etched selectively with respect to the encapsulation layer and/or the additional encapsulation layer. An etching selectivity is, for example, at least 500:1 or 10000:1.

The reflection layer may completely penetrate the current spreading layer in places. In other words, the current spreading layer is completely removed from an underside of the semiconductor layer sequence in places. In at least one partial region of the region from which the current spreading layer is completely removed, the reflection layer lies directly on the semiconductor layer sequence. The reflection layer can also penetrate into the semiconductor layer sequence in places so that the semiconductor layer sequence is partially removed and has recesses and/or trenches.

The current spreading layer may have an outer circumferential edge. The circumferential edge is electrically insulated from a center of the current spreading layer by a material of the reflection layer. In this case, the electrical contact regions for the current spreading layer are located in the center. Such an arrangement can be used to prevent the active zone from being supplied with current directly on facets of the semiconductor layer sequence. This increases the efficiency of the light-emitting diode chip.

The reflection layer may form a circumferential edge around the current spreading layer, viewed in a plan view. In this circumferential edge, the reflection layer preferably directly adjoins the semiconductor layer sequence and preferably completely covers outer boundary surfaces of the current spreading layer.

The edge may have a width of at least 1 µm or 3 µm or 5 µm. Alternatively or additionally, this width is at most 20 µm or 15 µm or 10 µm. The width of the edge makes up at least 0.1% or 0.3% of a mean edge length of the semiconductor layer sequence, seen in plan view. The edge can likewise make up at most 3% or 1% or 0.5% of the mean edge length.

A carrier may be located on a side of the current-conducting layer facing away from the semiconductor layer sequence. The carrier mechanically stabilizes and supports the light-emitting diode chip. In other words, the carrier can be that component of the light-emitting diode chip that mechanically supports the latter. For example, the carrier mechanically and/or electrically and/or thermally directly connects to the current-conducting layer by at least one solder.

The electrical contact region may have a central region and an edge region. In the central region, current is impressed from the electrical contact region into the current spreading layer. In the central region, the layers mentioned below preferably follow one another directly in the specified sequence: the current spreading layer, a metallic contact layer, a metallic adhesion layer and a first current-conducting layer, wherein the first current-conducting layer is at the same time a mirror layer.

The following layers may follow in the edge region in the specified sequence preferably directly one on top of the other: the current spreading layer, the contact layer, the adhesion layer, the additional encapsulation layer, a second current-conducting layer and the first current-conducting layer. The second current-conducting layer is a preferably light-transmissive layer, for instance made of a transparent conductive oxide such as ITO. The second current-conducting layer is preferably used as an adhesion-promoting layer. The first current-conducting layer is preferably a light-impermeable, metallic layer, for instance made of gold, which serves as a mirror layer.

I further provide a method by which a light-emitting diode chip is produced according to one or more of the above-mentioned examples. Features of the light-emitting diode chip are therefore also disclosed for the method and vice versa.

In at least one example of the method, the encapsulation layer is produced by atomic layer deposition. In contrast, the cover layer is produced by chemical or physical vapor deposition and, in contrast to the encapsulation layer, not by atomic layer deposition.

The physical vapor phase deposition, also referred to as PVD, is, for example, an evaporation method, sputtering, ion implantation or a so-called ICB technique (ionized cluster beam deposition). The chemical vapor deposition is, for example, plasma-enhanced, inductively or capacitively coupled, hot-wire activated or catalytic gas phase deposition. The CVD can be carried out at low pressure or at atmospheric pressure. A metal-organic or organometallic chemical vapor deposition can also be carried out.

The encapsulation layer produced by ALD and the cover layer produced by CVD or PVD differ in that a defect density in the ALD encapsulation layer is typically less than 0.1 defects per square millimeter, whereas the CVD or PVD coating layer has a defect density of a few 100 defects per square millimeter. This can be detected, for example, by transmission electron microscopy, TEM for short. Due to the comparatively lower defect density of the ALD encapsulation layer, an etching rate is also reduced, compared to the CVD or PVD cover layer. For example, the defect density and/or the etching rate can be used to unambiguously determine by which method a layer has been produced.

A light-emitting diode chip described here and a method described here are explained in more detail below with reference to the drawings on the basis of examples. Identical reference signs indicate the same elements in the individual figures. In this case, however, no relationships to scale are illustrated; rather, individual elements can be represented with an exaggerated size to afford a better understanding.

Figure 1:
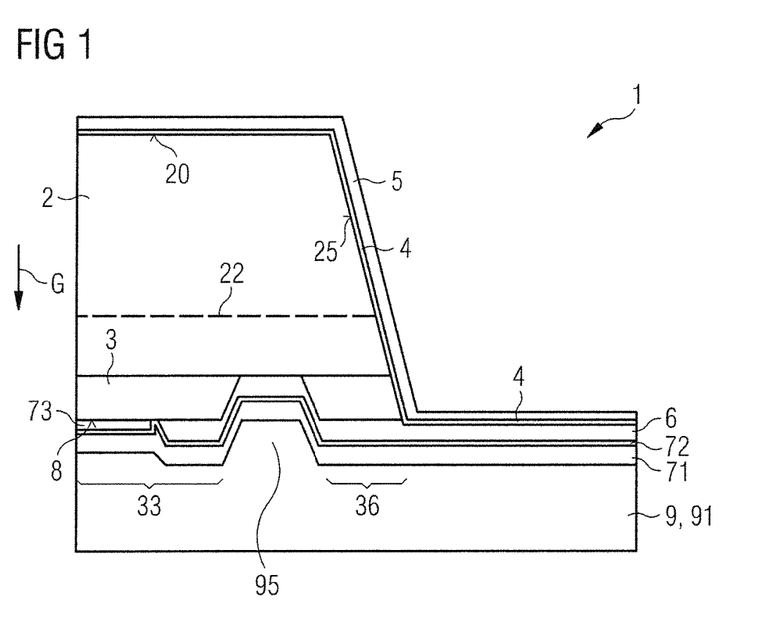
FIGS. 1, 3 to 8 and 10 to 16 show schematic sectional representations of examples of light-emitting diode chips described herein.

FIG. 1 shows an example of a light-emitting diode chip 1. The light-emitting diode chip 1 comprises a semiconductor layer sequence 2 having an active zone 22. The semiconductor layer sequence 2 is based on the material system InGaAlP. Radiation generated in the semiconductor layer sequence 2 during operation of the light-emitting diode chip 1, preferably red light, exits the semiconductor layer sequence 2 predominantly at a radiation main side 20.

On a side opposite the radiation main side 20, a current spreading layer 3 is located directly on the semiconductor layer sequence 2. The current spreading layer 3 is an AlGaAs layer. A thickness of the current spreading layer 3 is, for example, at least 120 nm and/or at most 500 nm, preferably approximately 200 nm. A thickness of the semiconductor layer sequence 2 is, for example, approximately 5 µm, wherein a region between the active zone 22 and the radiation main side 20 has a thickness of approximately 80% of the semiconductor layer sequence 2.

In contrast to the illustration, the current spreading layer 3 can also be composed of a plurality of partial layers, for example, from a thick AlGaAs layer and a thin GaAs layer having a thickness of at least 2 nm and/or 10 nm, wherein the GaAs layer is preferably located on a side of the thicker AlGaAs layer facing away from the semiconductor layer sequence 2. Such a GaAs layer is preferably also present in all other examples.

To electrically contact the current spreading layer 3, an electrical contact area 8 is located on a side facing away from the semiconductor layer sequence 2. Only one contact area 8 is shown in FIG. 1. However, preferably a plurality of the contact areas 8 is present, as is also the case in all other examples. The contact area 8 is preferably a p-contact.

The electrical contact area 8 is formed by a metallic contact layer 73. The metallic contact layer 73 is preferably produced from gold. Furthermore, an adhesion-promoting layer 72 and a metallic mirror layer 71 are present, preferably a gold layer or alternatively also a silver layer. Subsequently, the mirror layer 71 is also referred to as the first current-conducting layer, and the adhesion-promoting layer is also referred to as the second current-conducting layer. The electrical contact area 8 is electrically contacted via the current conducting layers 71, 72. The current-conducting layers 71, 72 preferably extend in the lateral direction over the entire light-emitting diode chip 1. The mirror layer 71 has, for example, a thickness of approximately 150 nm between the semiconductor layer sequence 2 and the mirror layer 71. The adhesion-promoting layer 72 is preferably an ITO layer, approximately with a thickness of about 100 nm. By the adhesion-promoting layer 72, adhesion between the mirror layer 71 and the current spreading layer 3 is improved.

In the direction away from the semiconductor layer sequence 2, the layers 71, 72 are followed by a solder layer 91, for example, an AuSn solder, by which the semiconductor layer sequence 2 is fastened to a carrier 9. A lateral current distribution across the light-emitting diode chip 1 takes place via the preferably electrically conductive carrier 9; the layers 71, 72 serve predominantly only for a current conduction in the direction perpendicular to the active zone 22.

A reflection layer 6 is located at least in places between the current-conducting layers 71, 72 and the current spreading layer 3. The reflection layer 6 is produced, for example, from silicon dioxide or silicon nitride or a layer sequence made of these materials. A thickness of the reflection layer 6 is preferably at least 150 nm or 200 nm or 300 nm and/or at most 1 µm or 700 nm or 600 nm. The reflection layer 6 has a uniform, constant thickness below the entire semiconductor layer sequence 2. Laterally next to the semiconductor layer sequence 2, the reflection layer 6 has a reduced, uniform thickness so that the encapsulation layer 4 extends at least partially laterally next to the reflection layer 6, which lies below the semiconductor layer sequence 2.

Via the reflection layer 6, which has a comparatively low optical refractive index, a total reflection of radiation generated in the active zone 22 is effected. In addition, in particular the first current-conducting layer 71 acts as a metallic mirror layer. The reflection layer 6 and the two current-conducting layers 71, 72, that is to say the mirror layer 71 and the adhesion-promoting layer 72, are also present in regions laterally alongside the semiconductor layer sequence 2, seen in plan view. Optionally, the second current-conducting layer 72 also extends between the first current-conducting layer 71 and the metallic contact layer 73, as shown in FIG. 1.

In an edge prism 95, the reflection layer 6 together with the current-conducting layers 71, 72 completely passes through the current spreading layer 3 and can also extend into the semiconductor layer sequence 2. As a result, a center 33 and a circumferential edge 36 of the current spreading layer 3 are formed, as seen in plan view. The one or, preferably, the more than one contact areas 8 are located in the center. The edge 36 is electrically insulated from the center 33 by the reflection layer 6 since the semiconductor layer sequence 2 has only a small lateral electrical conductivity in the region between the active zone 22 and the current spreading layer 3. Thus, a current impression into the active zone 22 of the semiconductor layer sequence 2 directly at a facet 25 is suppressed.

To protect the semiconductor layer sequence 2 from external influences, a cover layer 5 is applied to all exposed areas and also to the reflection layer 6. The cover layer 5 is preferably a silicon nitride layer applied by CVD or PVD.

However, the cover layer 5 is not sufficient for a permanent, efficient protection of the comparatively moisture-prone current spreading layer 3 made from AlGaAs. An encapsulation layer 4 is therefore produced below the cover layer 5. The encapsulation layer 4 is a low-defect, high-quality layer produced by atomic layer deposition. The encapsulation layer 4 is preferably produced from aluminum oxide, but can alternatively also be produced from tantalum oxide or silicon dioxide. By the encapsulation layer 4, in contrast to the cover layer 5, sufficient protection of the current spreading layer 3 is ensured.

The light-emitting diode chip 1 is produced in particular as follows:

The semiconductor layer sequence 2 is grown epitaxially on a growth substrate, not shown. In this case, a growth direction G points away from the radiation main side 20. The current spreading layer 3 is subsequently grown on the semiconductor layer sequence 2, after which the current spreading layer 3 is structured, for example, by etching so that the edge prism 95 is produced. In contrast to the illustration, a material can also be removed from the semiconductor layer sequence 2 so that the edge prism 95 can project not only as far as but also into the semi-conductor layer sequence 2, but preferably not as far as the active zone 22. The reflection layer 6, the current conducting layers 71, 72, the solder 91 and the carrier 9 are applied afterwards.

The growth substrate (not shown) is then removed. Optionally, a roughening (not shown in FIG. 1) is produced on the radiation main side 20, and furthermore optionally a protective layer (not shown), for example, made of $SiO_2$ or silicon nitride, is applied to the radiation main side 20. The semiconductor layer sequence 2 is then patterned by etching, as a result of which the facets 25 are formed and wherein the thickness of the reflection layer 6 in the region alongside the semiconductor layer sequence 2 is reduced. Finally, the encapsulation layer 4 and the cover layer 5 are applied.

Figure 2:
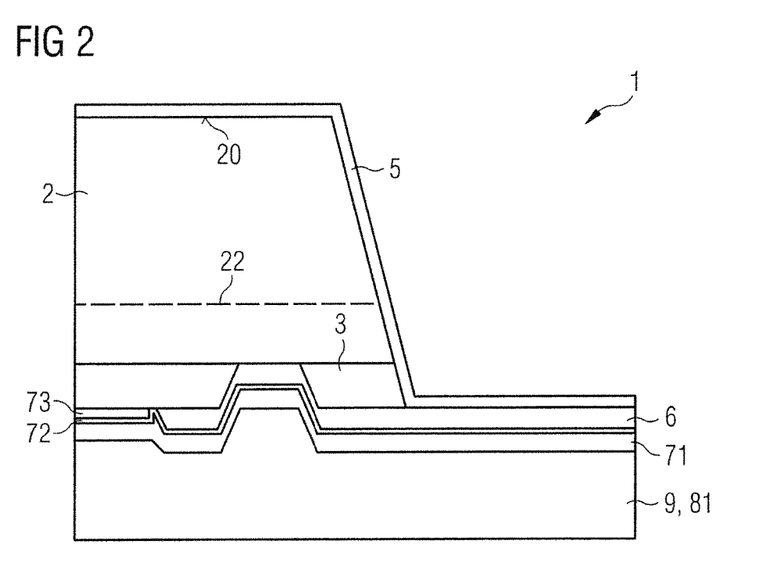
FIG. 2 shows a schematic sectional illustration of a modification of a light-emitting diode chip.

FIG. 2 illustrates a modification of a light-emitting diode chip. The light-emitting diode chip has no encapsulation layer 4, as illustrated in connection with FIG. 1. As a result, the current spreading layer 3 is not sufficiently protected against the influence of moisture, as a result of which a service life of the light-emitting diode chip is reduced.

Figure 3:
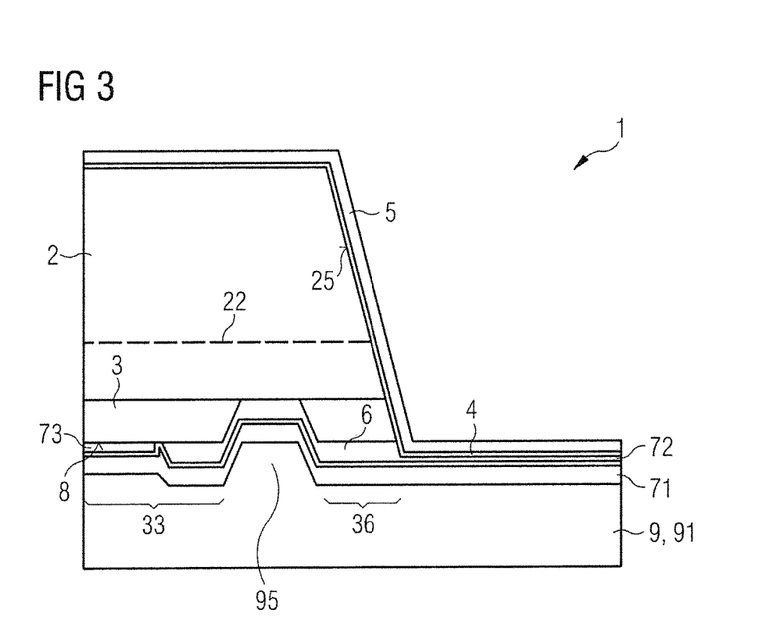

A further example is shown in FIG. 3. In contrast to FIG. 1, the reflection layer 6 does not project or does not significantly project beyond the current spreading layer 3 in a lateral direction. In the region next to the current spreading layer 3, viewed in a plan view, the reflection layer 6 is thus completely removed or, less preferred, still present in a reduced thickness. This means that, when the facets 25 are produced and during the structuring of the semiconductor layer sequence 2, the reflection layer 6 is partially or completely removed in the region next to the semiconductor layer sequence 2 by etching.

During production of the light-emitting diode chip 1 according to FIG. 3, after the structuring of the semiconductor layer sequence 2, of the current spreading layer 3 and of the reflection layer 6, the encapsulation layer 4 and the cover layer 5 are preferably applied directly one after the other. Thus, in the region alongside the semiconductor layer sequence 2, the encapsulation layer 4 can be applied directly to the second current-conducting layer 72. In this case, the encapsulation layer 4, in particular made of aluminum oxide, exhibits good adhesion to ITO, platinum, chromium, silicon dioxide or silicon nitride. Since the encapsulation layer 4 adheres comparatively poorly to gold or silver, the second current-conducting layer 72 made of ITO is preferably still present in the region alongside the semiconductor layer sequence 2.

The reflection layer 6 made of silicon dioxide is comparatively well permeable to moisture. Thus, in the example as shown in FIG. 3, improved protection of the current spreading layer 3 can be achieved since the reflection layer 6 is also covered on a side face by the encapsulation layer 4. As a result, the transport of $H_2O$ through the reflection layer 6 to the current spreading layer 3 is suppressed or at least greatly reduced.

Figure 4:
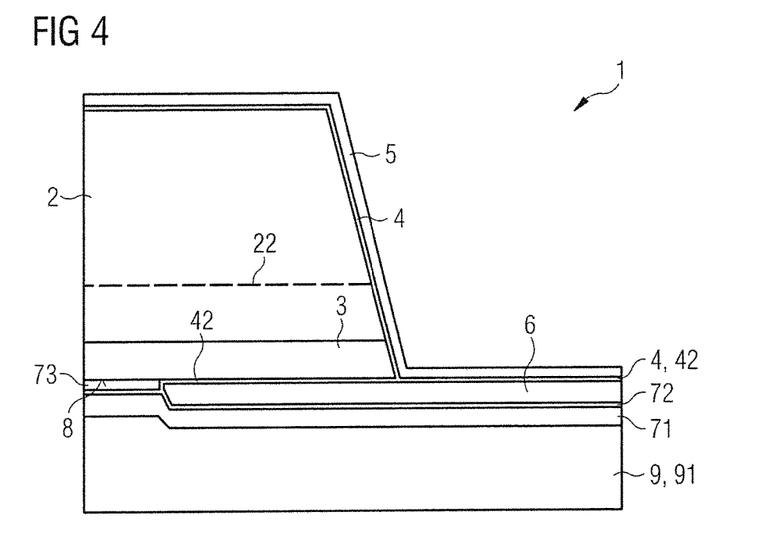

In the example of the light-emitting diode chip 1 as shown in FIG. 4, no edge prism 95 is present. The reflection layer 6 thus extends in a uniform thickness and lying in one plane from the electrical contact area 8 to an edge of the light-emitting diode chip 1.

In contrast to FIG. 1, an additional encapsulation layer 42 is present, which is likewise a layer produced by atomic layer deposition. The additional encapsulation layer 42, like the encapsulation layer 4, is also an aluminum oxide layer. The additional encapsulation layer 42 is applied to the current spreading layer 3 before the reflection layer 6. Consequently, the current spreading layer 3 is not in direct contact with the reflection layer 6 at any point and is protected from diffusion of moisture through the reflection layer 6. The additional encapsulation layer 42 is preferably applied over the whole area to the still unstructured semiconductor layer sequence 2 immediately after the current spreading layer 3 has been produced.

In the region laterally alongside the semiconductor layer sequence 2, the encapsulation layer 4 is thus applied directly to the additional encapsulation layer 42. In contrast to the additional encapsulation layer 42, the encapsulation layer 4 is produced just after the structuring of the semiconductor layer sequence 2.

Figure 5:
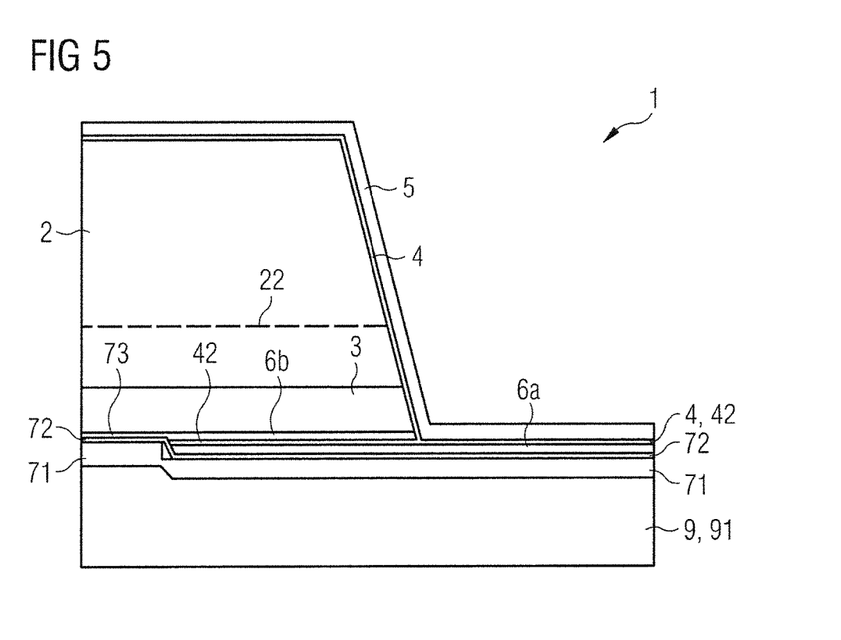

In the example of FIG. 5, the reflection layer is divided into two partial layers 6a, 6b. The partial layer 6b is located directly on the current spreading layer 3. In the region alongside the current spreading layer 3, the partial layer 6b is concomitantly removed during the patterning of the semiconductor layer sequence 2. In this case, the additional encapsulation layer 42, which is preferably an ALD layer made of $Al_2O_3$, acts as an etching stop layer since then the additional encapsulation layer 42 can be etched only poorly selectively with respect to the semiconductor material and with respect to the $SiO_2$ of the reflection layer 6b. The two partial layers 6a, 6b are separated from one another by the additional encapsulation layer 42. In the region next to the semiconductor layer sequence 2, as in FIG. 4, the encapsulation layer 4 is applied directly to the additional encapsulation layer 42 so that the partial layer 6b is completely removed from this region.

The partial layer 6b is thus laterally completely covered by the encapsulation layer 4 and completely covered by the additional encapsulation layer 42 on a side facing away from the current spreading layer 3. The partial layer 6b is thus completely encapsulated and the current spreading layer 3 is protected from diffusion. The two partial layers 6a, 6b can have identical or different thicknesses. For example, each of the partial layers 6a, 6b is 150 nm to 300 nm thick, in particular approximately 200 nm. However, the partial layer 6b can be designed thinner than the partial layer 6a and then have a thickness of at least 25 nm or 50 nm and/or of at most 80 nm or 150 nm.

In contrast to FIG. 5, an edge prism 95 can also be present in this example, analogously to FIG. 1.

Figure 6:
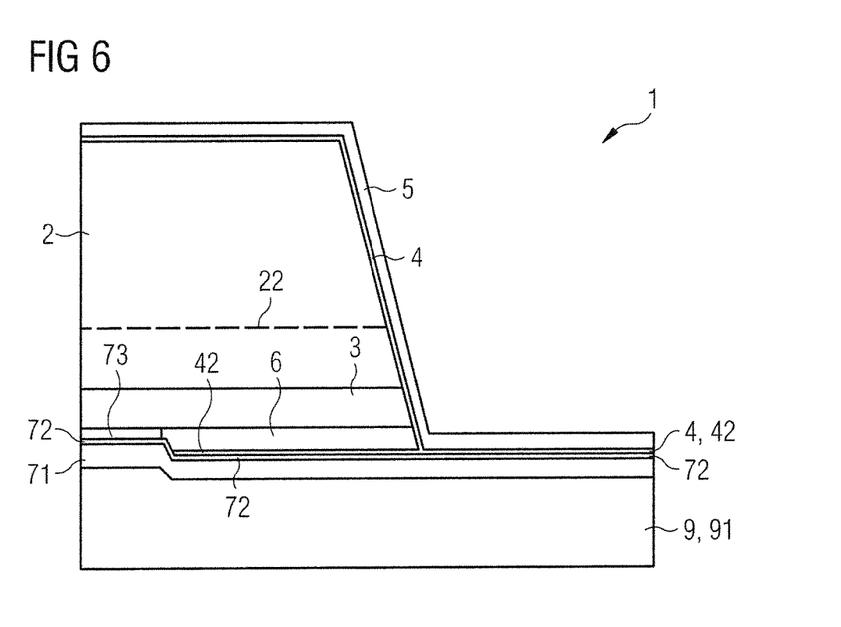

The example of FIG. 6 corresponds to the example of FIG. 3, but without the edge prism 95.

Figure 7:
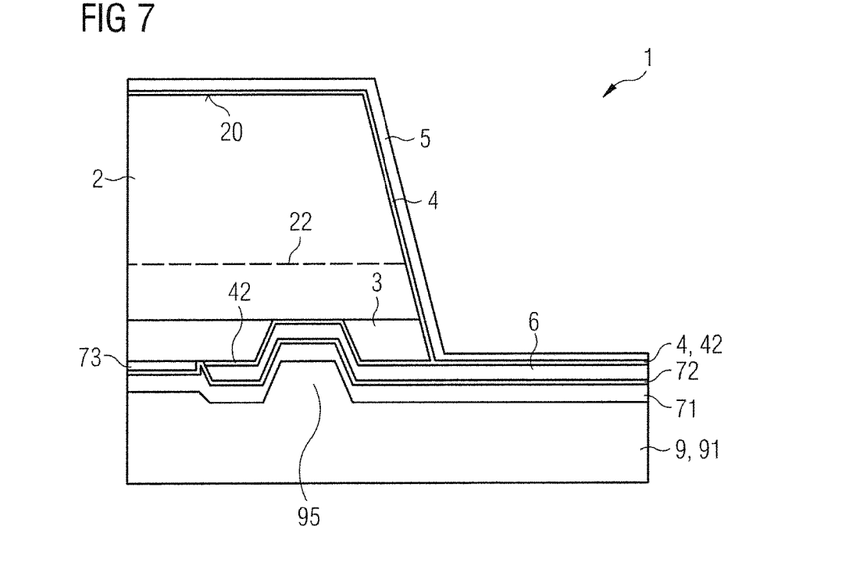

The example of the light-emitting diode chip 1 as shown in FIG. 7, corresponds to the example of FIG. 4, with the exception that the edge prism 95 is additionally present in FIG. 7.

Figure 8:
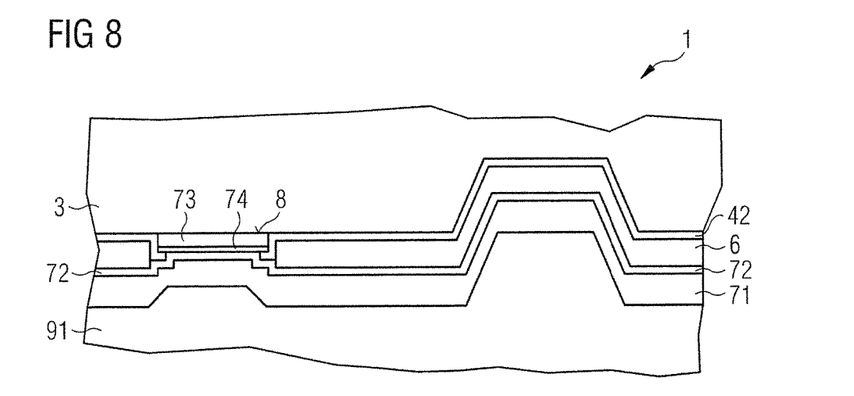

FIG. 8 shows a detailed view of the electrical contact area 8. Directly onto the metallic contact layer 73, which is preferably made of gold, a metallic adhesion layer 74 is applied, which is made, for example, of platinum, chromium, titanium, nickel or titanium-tungsten nitride. A thickness of the adhesion layer 74 is, for example, at most 15 nm or 5 nm. In an edge region of the contact area 8, the adhesion layer 74 follows the additional encapsulation layer 42, followed by the second current-conducting layer 72, for instance made of ITO, and the first current-conducting layer 71, for instance made of gold. The additional encapsulation layer 42 is not present in a central region of the contact area 8. If the second current-conducting layer, which serves as the adhesion-promoting layer 72, is formed from an electrically insulating material such as silicon dioxide, then the adhesion-promoting layer 72 is not present in the central region. The edge region has, for example, a width of at most 10% of a total width of the contact area 8. A correspondingly designed contact area 8 can also be present in all other examples.

Figure 9:
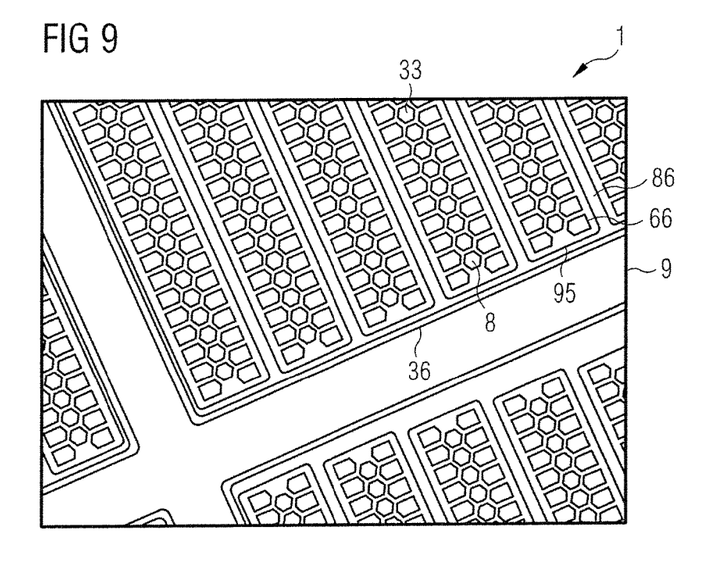
FIG. 9 shows a schematic plan view of a current spreading layer for examples of light-emitting diode chips described herein.

FIG. 9 shows a schematic plan view of the current spreading layer 3 of a plurality of light-emitting diode chips 1; the layers 4, 5, 6, 71, 72, 73, 74 are not shown in FIG. 9 to simplify the illustration. Adjacent light-emitting diode chips 1 are separated from one another by an unstructured strip. It can be seen that the edge prism is in the shape of a frame that extends around the entire center 33 with the contact areas 8 in a closed path. Likewise, the edge 36 completely surrounds the edge prism 95. The contact areas 8 are, for example, arranged in a rectangular or, as illustrated in FIG. 9, hexagonal pattern.

Optionally, light scattering structures 66 are present, which surround the contact areas 8 in a square pattern, wherein the light scattering structures 66, viewed in a plan view, can be shaped like an irregular pentagon. In addition, strip walls 86 are present which are preferably congruent with current spreading webs mounted on the radiation main side, not shown in FIG. 9. The light scattering structures 66 and the strip walls 86 are preferably constructed analogously to the edge prism 95 so that the reflection layer 6 can be guided to or into the semiconductor layer sequence 2 in the light scattering structures 66 and/or in the strip barriers 86.

Such a structure with edge prism 95 and/or light-scattering structure 66 and/or strip walls 86 is preferably also present in all other examples.

Figure 10:
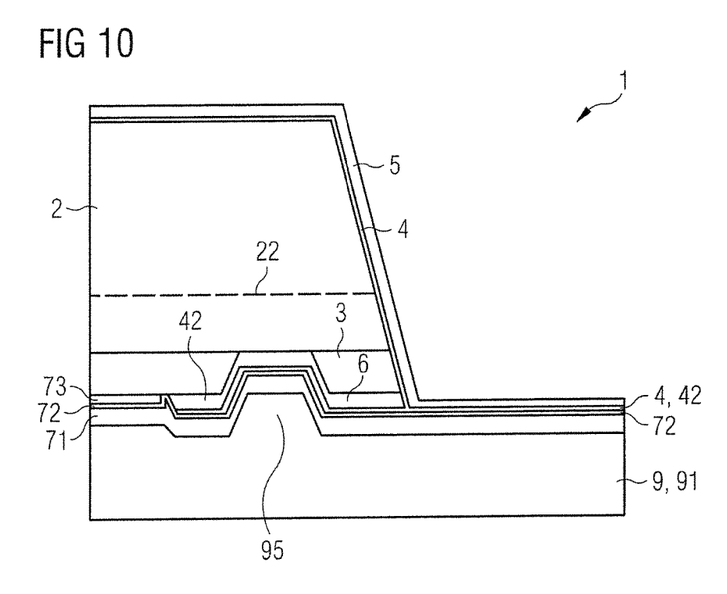

The example of FIG. 10 corresponds to the example of FIG. 6, wherein the edge prism 95 is additionally present. According to FIG. 10, a side face 25 of the reflection layer 6 is also covered by the encapsulation layer 4 and, laterally adjacent to the semiconductor layer sequence 2, the encapsulation layer 4 and the additional encapsulation layer 42 are applied directly to one another and in turn directly to the second current-conducting layer 72.

Figure 11:
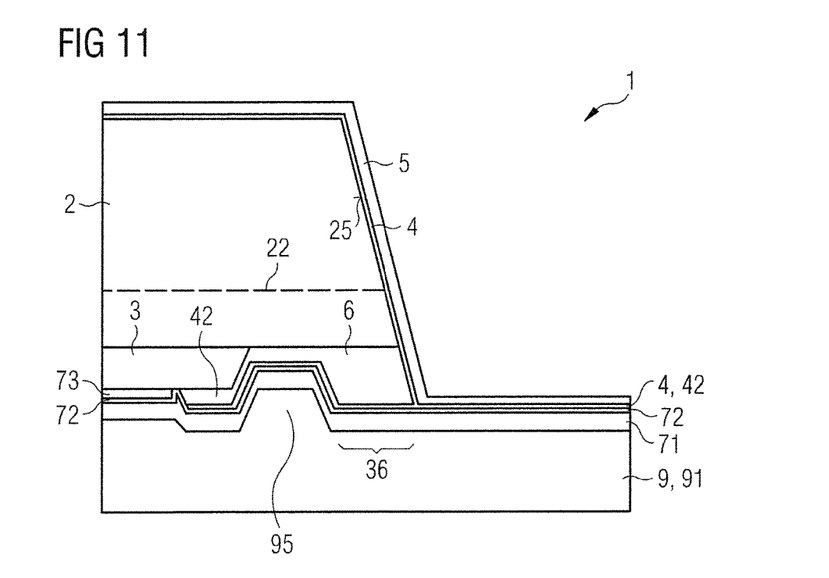

In the example of FIG. 11, coming from the edge prism 95, the reflection layer 6 extends, in prolongation of the facet 25, as far as to the encapsulation layer 4. In other words, the current spreading layer 3 is completely removed from the edge region 36 and replaced by the reflection layer 6.

Figure 12:
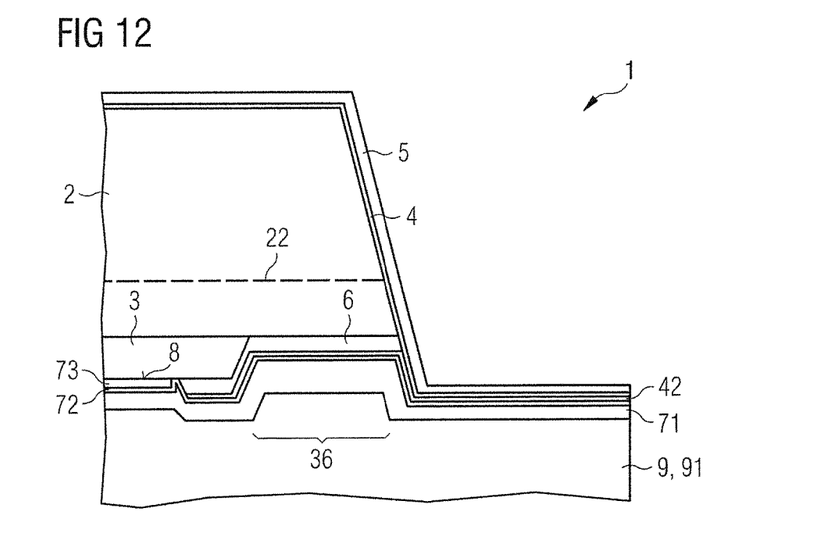

In the example of FIG. 12, too, the current spreading layer 3 is no longer present at the edge 36. Unlike in FIG. 11, the reflection layer 6 extends in a constant thickness up to the encapsulation layer 4.

Figure 13:
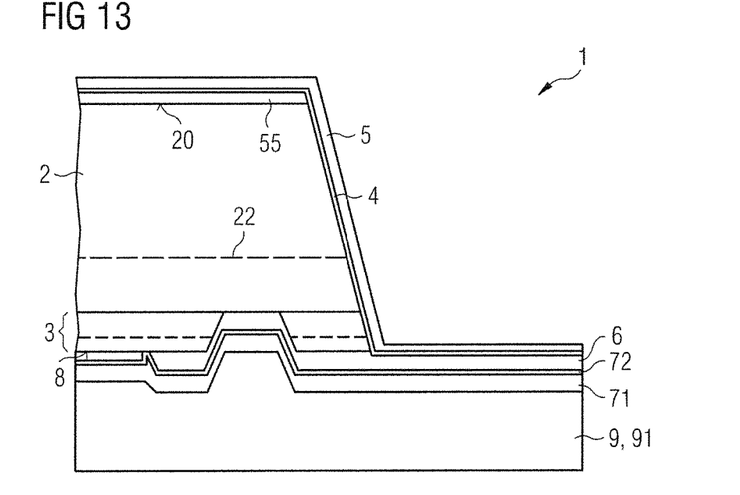

In the example of FIG. 13, a light-transmissive protective layer 55, made for instance of an electrically insulating material such as $SiO_2$ or silicon nitride or also of an electrically conductive material such as a thin metal or a TCO, is located directly on the radiation main side 20. The radiation main side 20 is completely covered by the protective layer 55. The encapsulation layer 4 is applied directly to the protective layer 55. Such a protective layer 55 can also be present in all other examples.

The protective layer 55 is located in particular on and/or in a roughening of the radiation main side 20. A thickness of the protective layer 55 is, when a TCO or an electrically insulating material is used for the protective layer, for example, at least 40 nm or 70 nm and/or at most 500 nm or 300 nm. It is possible that a roughening (not shown) is partially or completely planarized by the protective layer 55, as this can be the case for the encapsulation layer 4 and the cover layer 5. Optionally, the current spreading layer 3 is, as is also possible in all other examples, composed of a plurality of partial layers, which are symbolically separated from one another in FIG. 13 by a dashed line.

Figure 14:
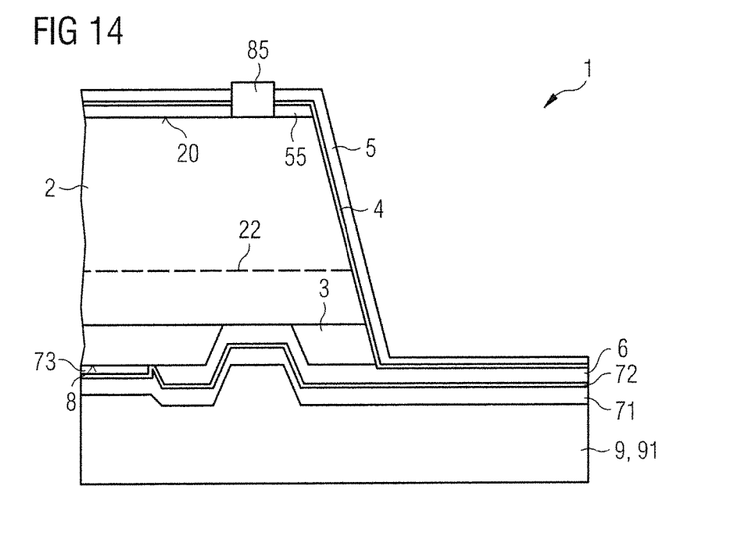

In the example of FIG. 14, an electrical contact 85 is located directly on the radiation main side 20, the contact being preferably an n-contact. The contact 85 can be formed from one or more metals, in particular in a plurality of partial layers, and can optionally comprise a TCO. In the region of the contact 85, the encapsulation layer 4 and the cover layer 5 and the optional protective layer 55 are opened. Furthermore, the contact 85 lies flat on the radiation main side 20 so that the radiation main side 20 has no recess at the contact 85. The contact 85 projects beyond the cover layer 5 and is preferably provided to be electrically contact-connected to a bonding wire.

During a contact processing and production of the contact 85, the protective layer 55, which serves as a passivation layer, can be advantageous since, when the encapsulation layer 4 is opened, the semiconductor layer sequence 2 is protected by the protective layer 55.

Proceeding from the contact 85, current spreading webs (not shown) can be present on the radiation main side 20 to achieve a more uniform current distribution across the light-emitting diode chip 1. Such current spreading webs preferably extend congruently with the strip walls 86 of FIG. 9.

Figure 15:
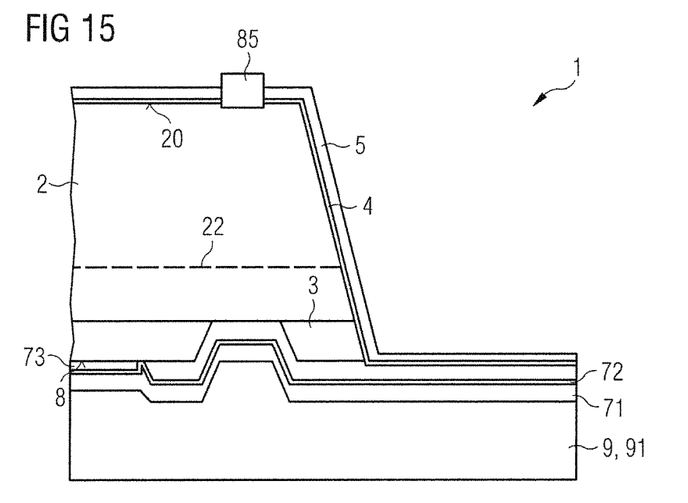

In the example of FIG. 15, the protective layer 55 is not present. As a result, the contact 85 may protrude into the semiconductor layer sequence 2 as a result of the production process.

Figure 16:
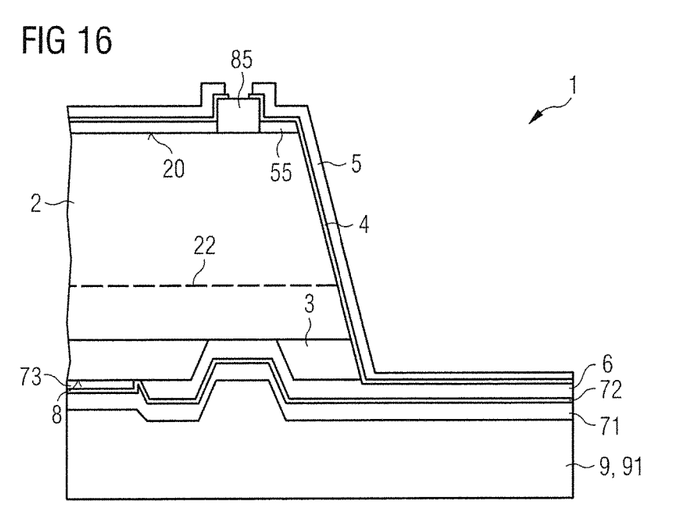

FIG. 16 shows a light-emitting diode chip 1 in which the contact 85 is applied to the n-side of the semiconductor layer sequence before the application of the encapsulation layer 4 and the cover layer 5. As a result, possible gaps between the protective layer 55 and the contact 85 can be closed. Analogously to the contact area 8 on the current spreading layer 3, compare FIG. 8, a Pt adhesive layer (not shown) is preferably present in the case of Au contacts 85, for example, to ensure the adhesion of the encapsulation layer 4 to the contact 85.

The encapsulation layer 4 and the cover layer 5 are preferably opened only at the contact 85, which is also used for external electrical contacting, for instance by a bonding wire. If necessary for external electrical contacting, the Pt adhesive layer can be removed in a bonding region, for example, by back-sputtering. If there are current spreading webs on the radiation main side, then, in the region of the current spreading webs, preferably neither the encapsulation layer 4 nor the cover layer 5 is opened.

The examples with the protective layer 55 and the contact 85 of FIGS. 13 to 16 are illustrated by way of example only for the light-emitting diode chip 1 of FIG. 1, but can also be transferred to the examples of FIGS. 3 to 11.

My chips and methods described here are not restricted by the description on the basis of the examples. Rather, this disclosure encompasses any new feature and also any combination of features, which includes in particular any combination of features in the appended claims, even if the feature or combination itself is not explicitly specified in the claims or examples.

This application claims priority of DE 10 2015 118 041.3, the subject matter of which is incorporated herein by reference.

The invention claimed is:

1. A light-emitting diode chip comprising:
   a semiconductor layer sequence based on InGaAlAsP and generates visible light or near-infrared radiation,
   a current spreading layer located directly on the semiconductor layer sequence and based on AlGaAs,
   an encapsulation layer applied directly to at least one of the current spreading layer and the semiconductor layer sequence and has an average thickness of 10 nm to 200 nm and a defect density of at most $10/mm^2$,
   at least one cover layer applied directly to the encapsulation layer,
   at least one non-metallic reflection layer located on a side of the current spreading layer facing away from the semiconductor layer sequence and covered by the encapsulation layer, and
   at least one of a mirror layer and an adhesion-promoting layer arranged on a side of the reflection layer facing away from the current spreading layers and supplies current to an electrical contact area,
   wherein the cover layer has a greater average thickness than the encapsulation layer,
   the encapsulation layer completely and directly covers outer facets of the current spreading layer, and
   the reflection layer projects beyond the current spreading layer and the semiconductor layer sequence, viewed in plan view, and the encapsulation layer is directly applied to partial regions of the reflection layer projecting beyond the current spreading layer.

2. The light-emitting diode chip according to claim 1, wherein the encapsulation layer is produced by atomic layer deposition and has a specific diffusion constant for at least one of water and oxygen of at most $10^{-5}$ g/(m$^2$ d), calculated on a material thickness of 100 nm, wherein the encapsulation layer is an $Al_2O_3$ layer.

3. The light-emitting diode chip according to claim 1, wherein the reflection layer, seen in plan view, terminates flush with the current spreading layer with a tolerance of at most 1 µm, and
   the encapsulation layer completely and directly covers outer facets of the current spreading layer and of the reflection layer.

4. The light-emitting diode chip according to claim 3, wherein the encapsulation layer is applied directly to the current spreading layer, viewed in a plan view, alongside the current spreading layer,
   the reflection layer is completely surrounded by the current spreading layer together with the encapsulation layer and the current spreading layer.

5. The light-emitting diode chip according to claim 1, wherein an additional encapsulation layer is applied directly to a side of the current spreading layer facing away from the semiconductor layer sequence, the additional encapsulation layer is produced by atomic layer deposition and is produced from the same material as the encapsulation layer.

6. The light-emitting diode chip according to claim 5, wherein the additional encapsulation layer touches the encapsulation layer, and
   a contact region of the additional encapsulation layer with the encapsulation layer is tightly sealed.

7. The light-emitting diode chip according to claim 5,
wherein the reflection layer is at no point in direct contact with the semiconductor layer sequence or the current spreading layer, and the semiconductor layer sequence and the current spreading layer are completely surrounded by the encapsulation layer together with the additional encapsulation layer and the at least one metallic, electrical contact area.

8. The light-emitting diode chip according to claim 5, wherein at least one of the encapsulation layer and the additional encapsulation layer constitute(s) an etching stop layer for at least one of the current spreading layer and for the reflection layer so that the current spreading layer can be etched selectively with respect to the encapsulation layer and the additional encapsulation layer.

9. The light-emitting diode chip according to claim 1,
wherein the reflection layer is divided at least into two partial layers which succeed one another along a growth direction of the semiconductor layer sequence, and at least one of the encapsulation layer and the additional encapsulation layer is/are located between the two partial layers.

10. The light-emitting diode chip according to claim 1, wherein the reflection layer completely penetrates the current spreading layer so that in a plan view the current spreading layer has an outer circumferential edge electrically insulated from a center of the current spreading layer by the reflection layer, and the at least one electrical contact area is located in the center.

11. The light-emitting diode chip according to claim 1,
wherein, viewed in a plan view, the reflection layer forms a circumferential edge around the current spreading layer, and at this edge the reflection layer directly adjoins the semiconductor layer sequence, and the edge has a width of at least 3 µm and at most 15 µm.

12. The light-emitting diode chip according to claim 1, wherein the current spreading layer is composed of a GaAs partial layer and at least one AlGaAs partial layer, the reflection layer is made of $SiO_2$, as the mirror layer, there is a first current-conducting layer made of gold and, as the adhesion-promoting layer, there is a second current-conducting layer made of indium-tin oxide, and the first and second current-conducting layers are applied directly to one another, the second current-conducting layer is located closer to the current spreading layer, and the two current-conducting layers laterally project beyond the current spreading layer, the cover layer is made of silicon nitride, and a carrier of the light-emitting diode chip is arranged on a side of the first current-conducting layer facing away from the semiconductor layer sequence, and the carrier is fastened to the current-conducting layers by at least one solder.

13. The light-emitting diode chip according to claim 1,
wherein at least one electrical contact region is arranged directly on a side of the current spreading layer facing away from the semiconductor layer sequence, the electrical contact region comprises a central region and an edge region, and the electrical contact region comprises the electrical contact area, the following layers follow one another directly in the specified sequence in the central region:

the current spreading layer, a metallic contact layer, a metallic adhesion layer, and the mirror layer, and the following layers follow one another directly in the specified sequence in the edge region:

the current spreading layer, the contact layer, the metallic adhesion layer, the additional encapsulation layer, the adhesion-promoting layer, and the mirror layer.

14. A method by which the light-emitting diode chip according to claim 1 is produced comprising:

producing the encapsulation layer by atomic layer deposition, and producing the cover layer by chemical or physical vapor deposition and not by atomic layer deposition.

15. A light-emitting diode chip comprising:
a semiconductor layer sequence based on InGaAlAsP and generates visible light or near-infrared radiation, a current spreading layer located directly on the semiconductor layer sequence and based on AlGaAs, an encapsulation layer applied directly to at least one of the current spreading layer and the semiconductor layer sequence and has an average thickness of 10 nm to 200 nm and a defect density of at most $10/mm^2$, at least one cover layer applied directly to the encapsulation layer, at least one non-metallic reflection layer located on a side of the current spreading layer facing away from the semiconductor layer sequence and covered by the encapsulation layer, and at least one of a mirror layer and an adhesion-promoting layer arranged on a side of the reflection layer facing away from the current spreading layers and supplies current to an electrical contact area, in which the reflection layer is divided at least into two partial layers which succeed one another along a growth direction of the semiconductor layer sequence, wherein at least one of the encapsulation layer and an additional encapsulation layer is/are located between the two partial layers.

16. The light-emitting diode chip according to claim 15,
wherein the cover layer has a greater average thickness than the encapsulation layer, the encapsulation layer completely and directly covers outer facets of the current spreading layer, and the reflection layer projects beyond the current spreading layer and the semiconductor layer sequence, viewed in plan view, and the encapsulation layer is directly applied to partial regions of the reflection layer projecting beyond the current spreading layer.

17. A light-emitting diode chip comprising:
a semiconductor layer sequence based on InGaAlAsP and generates visible light or near-infrared radiation, a current spreading layer located directly on the semiconductor layer sequence and based on AlGaAs, an encapsulation layer applied directly to at least one of the current spreading layer and the semiconductor layer sequence and has an average thickness of 10 nm to 200 nm and a defect density of at most $10/mm^2$, at least one cover layer applied directly to the encapsulation layer, at least one non-metallic reflection layer located on a side of the current spreading layer facing away from the semiconductor layer sequence and covered by the encapsulation layer, and at least one of a mirror layer and an adhesion-promoting layer arranged on a side of the reflection layer facing away from the current spreading layers and supplies current to an electrical contact area, in which the reflection layer completely penetrates the current spreading layer so that in a plan view the current spreading layer has an outer circumferential edge electrically insulated from a center of the current spreading layer by the reflection layer, and the one electrical contact area is located in the center.

18. A light-emitting diode chip comprising:

a semiconductor layer sequence based on InGaAlAsP and generates visible light or near-infrared radiation, a current spreading layer located directly on the semiconductor layer sequence and based on AlGaAs, an encapsulation layer applied directly to at least one of the current spreading layer and the semiconductor layer sequence and has an average thickness of 10 nm to 200 nm and a defect density of at most $10/mm^2$, at least one cover layer applied directly to the encapsulation layer, at least one non-metallic reflection layer located on a side of the current spreading layer facing away from the semiconductor layer sequence and covered by the encapsulation layer, and at least one of a mirror layer and an adhesion-promoting layer arranged on a side of the reflection layer facing away from the current spreading layers and supplies current to an electrical contact area, in which at least one electrical contact region is arranged directly on a side of the current spreading layer facing away from the semiconductor layer sequence, the electrical contact region comprises a central region and an edge region, and the electrical contact region comprises the electrical contact area, wherein the following layers follow one another directly in the specified sequence in the central region:

current spreading layer, a metallic contact layer, a metallic adhesion layer, and the mirror layer, and the following layers follow one another directly in the specified sequence in the edge region:

the current spreading layer, the contact layer, the metallic adhesion layer, an additional encapsulation layer, the adhesion-promoting layer, and the mirror layer.

* * * * *